(12) United States Patent
Park et al.

(10) Patent No.: US 10,847,102 B2
(45) Date of Patent: Nov. 24, 2020

(54) DISPLAY DEVICE

(71) Applicant: Samsung Display Co., Ltd., Yongin-si (KR)

(72) Inventors: Doyeong Park, Hwaseong-si (KR); Seulbee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/392,550

(22) Filed: Apr. 23, 2019

(65) Prior Publication Data

US 2019/0355318 A1   Nov. 21, 2019

(30) Foreign Application Priority Data

May 17, 2018   (KR) .................. 10-2018-0056662

(51) Int. Cl.
*G09G 3/36* (2006.01)
*H01L 27/12* (2006.01)

(52) U.S. Cl.
CPC ......... *G09G 3/3614* (2013.01); *G09G 3/3648* (2013.01); *H01L 27/124* (2013.01);
(Continued)

(58) Field of Classification Search
CPC ............... G02F 1/1333; G02F 1/1343; G02F 1/134336; G02F 1/13458; G02F 1/136213; G02F 1/136227; G02F 1/136286; G02F 1/1368; G09G 3/3233; G09G 3/3611; G09G 3/3614; G09G 3/3648; G09G 2320/0233; G09G 2300/0426; G09G 2300/043; G09G 2300/0439; G09G 2300/0443; G09G 2300/0447; G09G 2300/0452; G09G 2300/0842; G09G 2300/0852; G09G 2300/0861; G09G 2300/0876; G09G 2310/0262; G09G 2320/0209; G09G 2320/0219; G09F 9/30; H01L 27/124; H01L 27/1255; H01L 27/127;
(Continued)

(56) References Cited

U.S. PATENT DOCUMENTS 7,973,870 B2   7/2011   Chung et al.
8,111,366 B2   2/2012   Kim
(Continued)

FOREIGN PATENT DOCUMENTS

KR   10-1246756      3/2013
KR   10-2013-0105777   9/2013
KR   10-1304417      9/2013

*Primary Examiner* — Michael J Eurice
(74) *Attorney, Agent, or Firm* — H.C. Park & Associates, PLC

(57) ABSTRACT

A display device includes: a first data line and a second data line extending along a first direction; a first pixel including a first pixel transistor and a first pixel electrode electrically connected to the first data line; and a second pixel including a second pixel transistor and a second pixel electrode, the second pixel being spaced apart from the first pixel in the first direction and electrically connected to the second data line, wherein the first pixel electrode may include: a first main pixel electrode; and a first compensation electrode overlapping the first data line on a plane, wherein a portion of the second pixel transistor may overlap the first main pixel electrode on a planar view.

18 Claims, 8 Drawing Sheets

(52) U.S. Cl.
 CPC ............... *G09G 2300/043* (2013.01); *G09G 2300/0426* (2013.01); *G09G 2320/0209* (2013.01); *G09G 2320/0219* (2013.01); *G09G 2320/0233* (2013.01)

(58) Field of Classification Search
 CPC ............ H01L 27/3246; H01L 27/3248; H01L 27/326; H01L 27/3262; H01L 27/3265; H01L 27/3276; H01L 29/42384; H01L 29/786; H01L 51/0023
 See application file for complete search history.

(56) References Cited

U.S. PATENT DOCUMENTS

| | | | |
|---|---|---|---|
| 9,927,669 B2 | 3/2018 | Lim et al. | |
| 2001/0040663 A1* | 11/2001 | Jun | G02F 1/134363 349/141 |
| 2005/0030460 A1* | 2/2005 | Kim | G02F 1/133707 349/139 |
| 2005/0098781 A1* | 5/2005 | Park | G02F 1/136286 257/59 |
| 2005/0185107 A1* | 8/2005 | Ban | G02F 1/136209 349/42 |
| 2005/0236624 A1* | 10/2005 | Kim | H01L 29/456 257/66 |
| 2005/0253979 A1* | 11/2005 | Hong | G02F 1/136213 349/43 |
| 2005/0280749 A1* | 12/2005 | Jung | G02F 1/133707 349/43 |
| 2006/0267914 A1* | 11/2006 | Chang | G02F 1/1345 345/100 |
| 2007/0177067 A1* | 8/2007 | Kim | G02F 1/13624 349/43 |
| 2008/0036932 A1* | 2/2008 | Lee | G02F 1/133707 349/38 |
| 2008/0094560 A1* | 4/2008 | Baek | G02F 1/134336 349/144 |
| 2008/0210940 A1* | 9/2008 | Lee | G02F 1/13624 257/59 |
| 2009/0278130 A1* | 11/2009 | Jun | G02F 1/136213 257/59 |
| 2010/0141849 A1* | 6/2010 | Enda | G02F 1/13624 348/731 |
| 2010/0296015 A1* | 11/2010 | Kim | G02F 1/134309 349/37 |
| 2011/0089424 A1* | 4/2011 | Hur | G02F 1/136213 257/59 |
| 2011/0095294 A1* | 4/2011 | Lee | H01L 27/124 257/59 |
| 2011/0096258 A1* | 4/2011 | Shim | G02F 1/1333 349/39 |
| 2011/0205462 A1* | 8/2011 | Lee | G02F 1/136213 349/38 |
| 2011/0216249 A1* | 9/2011 | Tsubata | G02F 1/136213 348/731 |
| 2012/0206658 A1* | 8/2012 | Yoshida | G02F 1/136213 348/731 |
| 2013/0120466 A1* | 5/2013 | Chen | G09G 3/3648 345/690 |
| 2013/0229609 A1* | 9/2013 | Jeong | G02F 1/133707 349/138 |
| 2013/0241905 A1 | 9/2013 | Kim et al. | |
| 2014/0021475 A1* | 1/2014 | Moon | H01L 29/786 257/59 |
| 2014/0117340 A1* | 5/2014 | Kim | H01L 27/1255 257/40 |
| 2014/0124754 A1* | 5/2014 | Park | G09G 3/32 257/40 |
| 2014/0247409 A1* | 9/2014 | Shin | G09G 3/3659 349/41 |
| 2014/0368762 A1* | 12/2014 | Kawabata | G09G 3/3655 349/39 |
| 2015/0270327 A1* | 9/2015 | Oh | H01L 51/5209 257/40 |
| 2016/0035271 A1* | 2/2016 | Lee | G02F 1/13624 345/215 |
| 2017/0012094 A1* | 1/2017 | Lee | G09G 3/3233 |
| 2017/0023833 A1* | 1/2017 | No | G02F 1/134309 |
| 2017/0053975 A1* | 2/2017 | Cho | H01L 27/3265 |
| 2017/0184932 A1 | 6/2017 | Park et al. | |
| 2017/0322468 A1* | 11/2017 | Kim | G02F 1/133345 |
| 2018/0011355 A1* | 1/2018 | Miyake | G09G 3/3648 |
| 2019/0355318 A1* | 11/2019 | Park | H01L 27/124 |

* cited by examiner

DISPLAY DEVICE

CROSS-REFERENCE TO RELATED APPLICATION

This application claims priority from and the benefit of Korean Patent Application No. 10-2018-0056662, filed on May 17, 2018, which is hereby incorporated by reference for all purposes as if fully set forth herein.

BACKGROUND

Field

Exemplary embodiments of the invention relate generally to a display device with improved image quality.

Discussion of the Background

A liquid crystal display device among display devices includes a liquid crystal display panel including two substrates facing each other and a liquid crystal layer disposed between the two substrates. A liquid crystal display device applies a voltage to an electric field generating electrode (for example, a pixel electrode and a common electrode) to generate an electric field in the liquid crystal layer. Accordingly, the alignment direction of the liquid crystal molecules in the liquid crystal layer is determined, and the image is displayed by controlling the polarization of the incident light.

A parasitic capacitance may be formed between the data line and the pixel electrode of the liquid crystal display device. The parasitic capacitance may change the voltage of the pixel electrode and as a result, the luminance of the pixel may be changed. Therefore, the image quality of the display device may be degraded.

The above information disclosed in this Background section is only for understanding of the background of the inventive concepts, and, therefore, it may contain information that does not constitute prior art.

SUMMARY

Devices constructed according to exemplary implementations of the invention are capable of providing a display device with improved image quality.

Additional features of the inventive concepts will be set forth in the description which follows, and in part will be apparent from the description, or may be learned by practice of the inventive concepts.

According to one or more exemplary embodiments of the invention, a display device includes: a first pixel transistor; a first gate line electrically connected to the first pixel transistor; a first data line electrically connected to the first pixel transistor; a first pixel electrode electrically connected to the first pixel transistor and configured to overlap the first data line on a planar view, the first pixel electrode including: a first main pixel electrode; a first contact electrode contacting the first pixel transistor; a first connection electrode connecting the first main pixel electrode and the first contact electrode; and a first compensation electrode extending from the first contact electrode, spaced apart from the first connection electrode, and overlapping the first data line on the planar view; and a second data line configured to overlap the first pixel electrode on the planar view.

The display device may further include: a second pixel electrode spaced apart from the first pixel electrode in a first direction; a second pixel transistor electrically connected to the second pixel electrode and the second data line; and a second gate line electrically connected to the second pixel transistor, wherein the second pixel electrode may include: a second main pixel electrode; a second contact electrode contacting the second pixel transistor; a second connection electrode connecting the second main pixel electrode and the second contact electrode; and a second compensation electrode extending from the second contact electrode, spaced apart from the second connection electrode, and overlapping the second data line on the planar view, wherein a compensation capacitance may be formed between the second compensation electrode and the second data line.

The first pixel transistor may include a control electrode extending from the first gate line, a first electrode extending from the first data line, and a second electrode connected to the first contact electrode, wherein a portion of the first electrode may overlap the second main pixel electrode on the planar view.

A first capacitance may be formed between the second data line and the second pixel electrode, wherein a second capacitance may be sum of a capacitance formed between the first data line and the second pixel electrode and a capacitance formed between the first electrode and the second pixel electrode, and wherein the first capacitance may be substantially equal to the second capacitance.

The first capacitance may include a capacitance formed between the second data line and the second main pixel electrode and the compensation capacitance.

The first gate line and the second gate line may be configured to receive the same signal.

The first compensation electrode may be disposed between the first connection electrode and the second main pixel electrode on the planar view.

The display device may further include a pixel common electrode disposed between the first pixel electrode and the second pixel electrode, wherein the first compensation electrode may be disposed between the first connection electrode and the pixel common electrode on the planar view.

The first connection electrode may include a first sub connection electrode and a second sub connection electrode, wherein the first sub connection electrode may overlap the first data line on the planar view, and wherein the second sub connection electrode may overlap the second data line on the planar view.

The first data line and the second data line may be configured to receive data voltages of different polarities.

According to one or more exemplary embodiments of the invention, a display device includes: a first data line and a second data line extending along a first direction; a first pixel including a first pixel transistor and a first pixel electrode electrically connected to the first data line; and a second pixel including a second pixel transistor and a second pixel electrode, the second pixel being spaced apart from the first pixel in the first direction and electrically connected to the second data line, wherein the first pixel electrode may include: a first main pixel electrode; and a first compensation electrode overlapping the first data line on a plane, wherein a portion of the second pixel transistor may overlap the first main pixel electrode on a planar view.

A first capacitance may be a sum of a capacitance formed between the first data line and the first main pixel electrode and a capacitance formed between the first data line and the compensation electrode, wherein a second capacitance may be a sum of a capacitance formed between the first main pixel electrode and the second data line and a capacitance formed between the first main pixel electrode and the portion of the second pixel transistor overlapping the first main pixel, and wherein the compensation electrode may be adjusted so that the first capacitance is substantially equal to the second capacitance.

The display device may further include: a first gate line extending along a second direction intersecting the first direction and electrically connected to the first pixel transistor; and a second gate line extending along the second direction and electrically connected to the second pixel transistor, wherein the first gate line and the second gate line may be configured to receive the same signal.

The first pixel transistor may include a control electrode extending from the first gate line, a first electrode extending from the first data line, and a second electrode connected to the first pixel electrode, wherein a portion of the first electrode may overlap the second pixel electrode on the planar view.

The first pixel electrode may overlap the first data line and the second data line on the planar view and the second pixel electrode overlaps the first data line and the second data line on the planar view.

The first compensation electrode may be disposed in an area between the first main pixel electrode and the first pixel transistor on the planar view.

The first pixel electrode may further include: a first contact electrode contacting the first pixel transistor; and a first sub connection electrode connecting the first main pixel electrode and the first contact electrode, and overlapping the first data line on the planar view.

The display device may further include a second sub connection electrode connecting the first main pixel electrode and the first contact electrode and overlapping the second data line on the planar view.

The first compensation electrode may be spaced apart from the first sub connection electrode on the planar view.

The second pixel electrode may include: a second main pixel electrode; a second contact electrode contacting the second pixel transistor; a second connection electrode connecting the second main pixel electrode and the second contact electrode; and a second compensation electrode extending from the second contact electrode, spaced apart from the second connection electrode, and overlapping the second data line on the planar view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
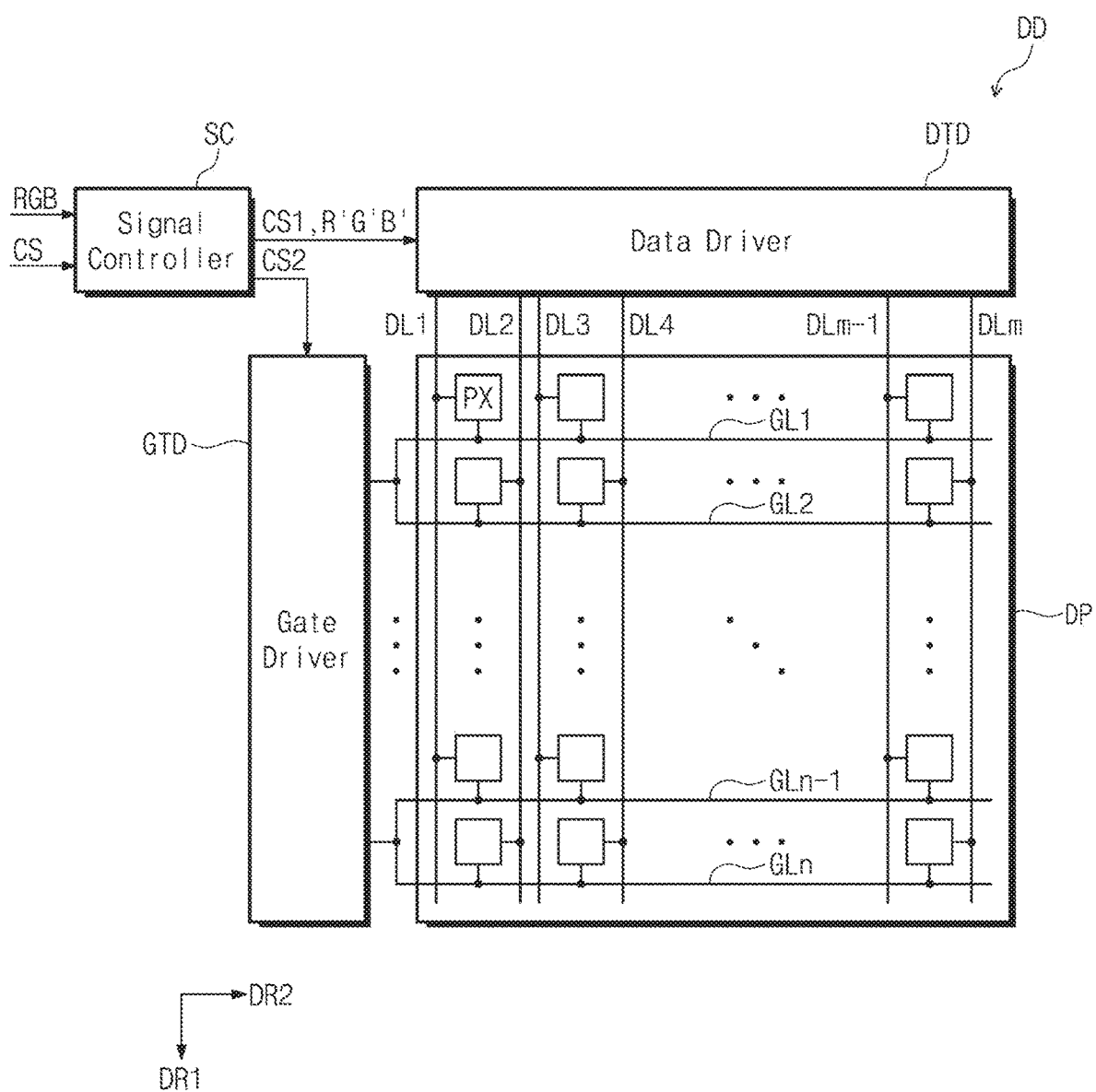
FIG. 1 is a schematic diagram of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense.

For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic diagram of a display device according to an exemplary embodiment.

Referring to FIG. 1, a display device DD may include a display panel DP, a signal controller SC, a data driver DTD, and a gate driver GTD.

The display device DD may be used in medium-sized electronic devices such as personal computers, notebook computers, personal digital terminals, car navigation units, game machines, portable electronic devices, tablets, and cameras in addition to large-sized electronic devices such as televisions, monitors, or external billboards. However, the exemplary embodiments are not limited thereto, and the display device DD may be employed in any electronic devices without departing from the scope.

The display panel DP may be a light receiving display panel. For example, the display panel DP may be a liquid crystal display panel. The display panel DP receives light from a light source unit (not shown), and controls an amount of transmitted light to display an image.

The display panel DP may include data lines DL1 to DLm, gate lines GL1 to GLn, and pixels PX. The data lines DL1 to DLm may extend in the first direction DR1 and may be arranged in the second direction DR2 that intersects the first direction DR1. The gate lines GL1 to GLn may extend in the second direction DR2 and may be arranged along the first direction DR1. The data lines DL1 to DLm and the gate lines GL1 to GLn may define pixel regions, and the pixel regions may include pixels PX for displaying an image.

The signal controller SC may be a timing controller. The signal controller SC receives image data RGB and a control signal CS provided from the outside. The control signal CS may include a vertical synchronization signal, a horizontal synchronization signal, a main clock signal, and a data enable signal.

The signal controller SC generates the converted image data R'G'B' by converting the image data RGB to match the operation of the display panel DP. The signal controller SC outputs the converted image data R'G'B' to the data driver DTD.

The signal controller SC provides the first control signal CS1 to the data driver DTD and the second control signal CS2 to the gate driver GTD. The first control signal CS1 is a signal for controlling the data driver DTD and the second control signal CS2 is a signal for controlling the gate driver GTD.

The data driver DTD may provide a data signal to the plurality of data lines DL1 to DLm in response to the first control signal CS1. The data driver DTD may be implemented as an independent integrated circuit chip and may be electrically connected to one side of the display panel DP or may be integrated into a predetermined region of the display panel DP. When the data driver DTD is provided as an independent integrated circuit chip, the integrated circuit chip may be provided as a single chip or may be provided as a plurality of chips.

The gate driver GTD may provide a gate signal to the gate lines GL1 to GLn in response to the second control signal CS2. The gate driver GTD may be integrated in a predetermined area of the display panel DP. The gate driver GTD may be implemented as an amorphous silicon gate driver (ASG) using an amorphous Silicon Thin Film Transistor (a-Si TFT), an oxide silicon gate driver (OSG) using an oxide silicon thin film transistor, and a circuit using oxide semiconductor, crystalline semiconductor, and polycrystalline semiconductor. Also, the gate driver GTD may be implemented as an independent integrated circuit chip and electrically connected to one side of the display panel DP.

The gate driver GTD may include shift registers. In one exemplary embodiment, one shift register may be connected to two gate lines. Referring to FIG. 1, the first gate line GL1 and the second gate line GL2 may be electrically connected to each other. Therefore, the first gate line GL1 and the second gate line GL2 may receive the same signal.

Figure 2:
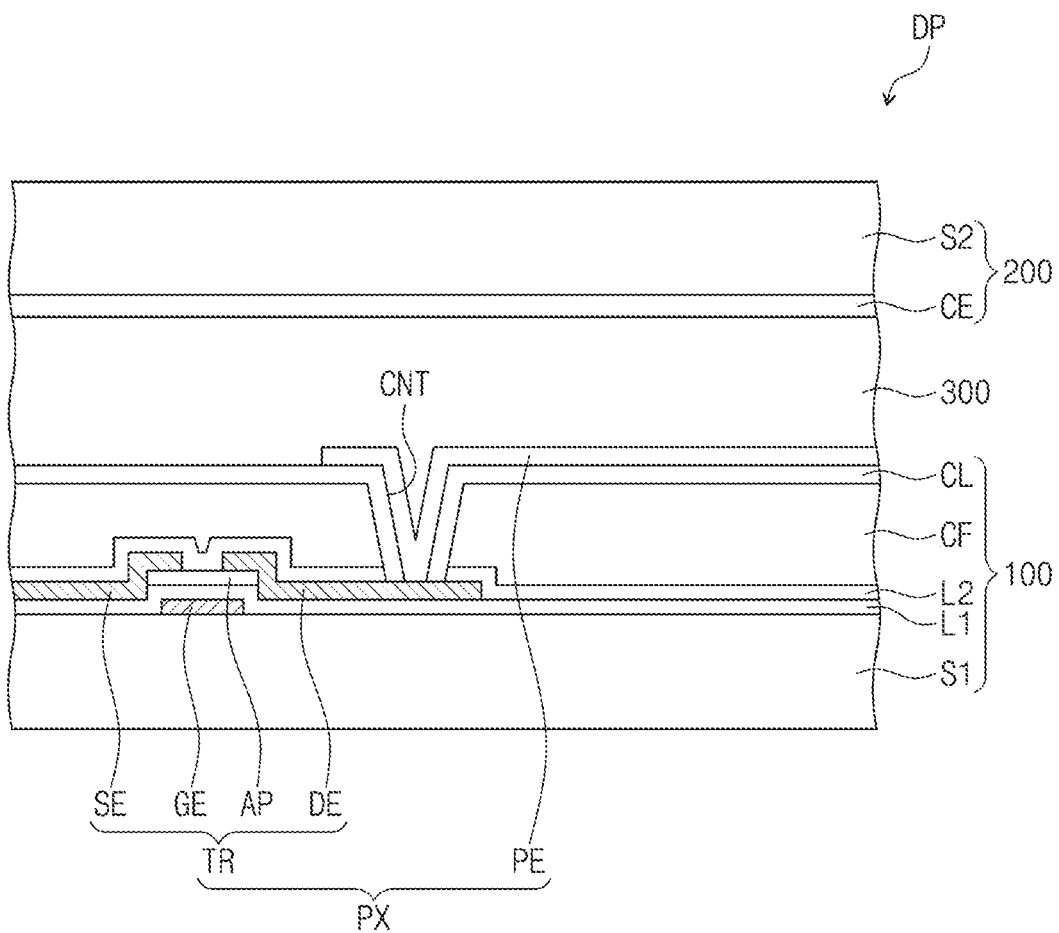
FIG. 2 is a cross-sectional view of a display panel according to an exemplary embodiment.

FIG. 2 is a cross-sectional view of a display panel according to an exemplary embodiment.

Referring to FIG. 2, the display panel DP may include a first substrate 100, a second substrate 200, and a liquid crystal layer 300.

The first substrate 100 may include a first base substrate S1, a pixel PX, insulating layers L1 and L2, a color filter CF, and a capping layer CL.

The first base substrate S1 may include an insulating material. For example, the first base substrate S1 may be a silicon substrate, a plastic substrate, an insulating film, a laminated structure, a glass substrate, or a quartz substrate. The laminated structure may include a plurality of insulating layers. The first base substrate S1 may be optically transparent. Accordingly, the light generated from a light source unit (not shown) may easily reach the liquid crystal layer 300 through the first base substrate S1.

The pixel PX may include a pixel transistor TR and a pixel electrode PE. The pixel transistor TR may include a control electrode GE, a first electrode SE, a second electrode DE, and a semiconductor pattern AP.

The control electrode GE may be disposed on the first base substrate S1. The first insulating layer L1 is disposed on the control electrode GE. The first insulating layer L1 may cover the first control electrode GE. The semiconductor pattern AP may be disposed on the first insulating layer L1. The semiconductor pattern AP may be disposed apart from the control electrode GE on a cross section.

The semiconductor pattern AP may include a semiconductor material. For example, the semiconductor material may include at least one of amorphous silicon, polycrystalline silicon, single crystal silicon, an oxide semiconductor, and a compound semiconductor.

The first electrode SE and the second electrode DE may be disposed on the semiconductor pattern AP. The second insulating layer L2 may be disposed on the first electrode SE and the second electrode DE. The second insulating layer L2 may cover the first electrode SE and the second electrode DE.

The color filter CF may be disposed on the second insulating layer L2. The color filter CF may be a red, blue, or green color filter. However, this is merely an example and the exemplary embodiments are not limited thereto, and the color filter CF may be omitted. If the color filter CF is omitted, an insulating layer may be provided instead of the color filter CF. The insulating layer may include an organic material and may provide a flat surface.

The capping layer CL covering the color filter CF may be disposed on the color filter CF. The capping layer CL may include an inorganic material. For example, the capping layer CL may include silicon nitride or silicon oxide.

The pixel electrode PE may be disposed on the capping layer CL. The pixel electrode PE may be electrically connected to the second electrode DE exposed by the contact hole CNT. For example, the pixel electrode PE may directly contact the second electrode DE. However, this is merely an example and the exemplary embodiments are not limited thereto. In another exemplary embodiment, a conductive layer may be disposed between the pixel electrode PE and the second electrode DE.

The second substrate 200 may include a second base substrate S2 and a common electrode CE. In another exemplary embodiment, when the first substrate 100 does not include the color filter CF, the second substrate 200 may further include a color filter. For example, a color filter may be provided between the second base substrate S2 and the common electrode CE.

The second base substrate S2 may be an optically transparent insulating substrate. The second base substrate S2 may include the same material as the first base substrate S1. Accordingly, description for this is omitted.

The common electrode CE may be disposed between the second base substrate S2 and the liquid crystal layer 300. The common electrode CE may form an electric field with the pixel electrode PE.

The liquid crystal layer 300 is disposed between the first substrate 100 and the second substrate 200. The liquid crystal layer 300 may include liquid crystal molecules having dielectric anisotropy. The arrangement of the liquid crystal molecules may be changed according to an electric field formed between the common electrode CE and the pixel electrode PE.

Figure 3:
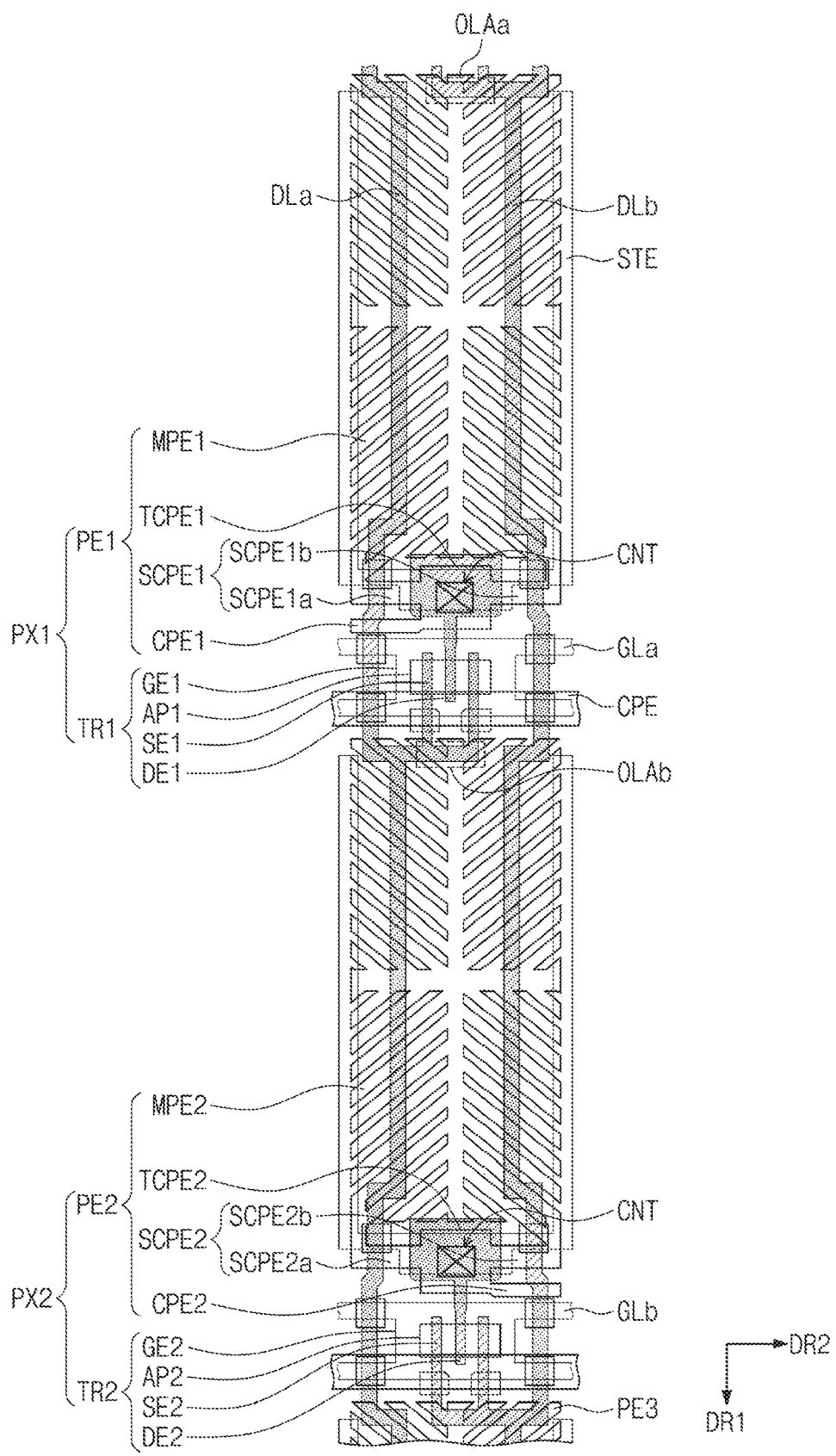
FIG. 3 is an enlarged plan view of a part of a display panel illustrating a first pixel and a second pixel according to an exemplary embodiment.
Figure 4:
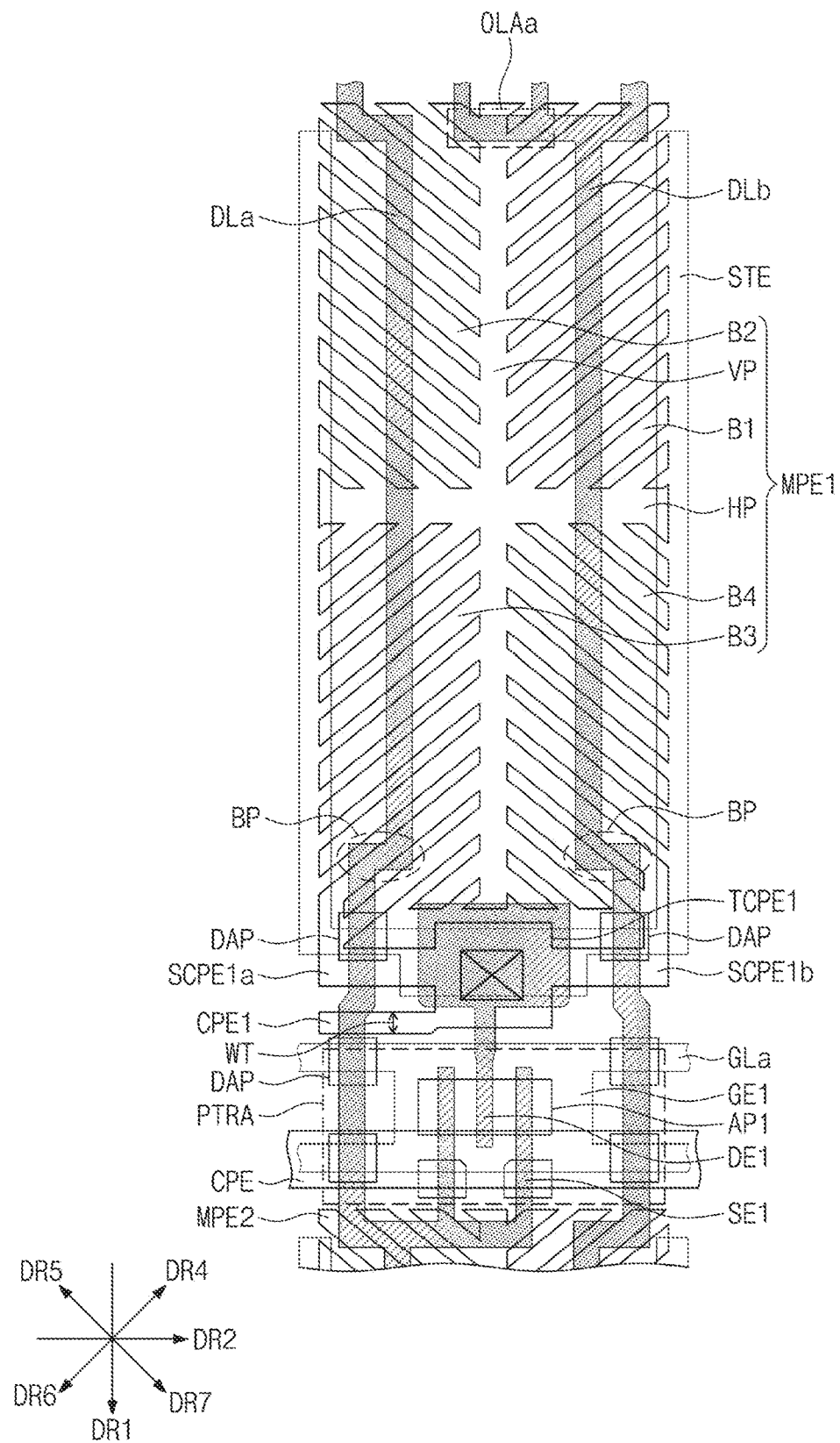
FIG. 4 is an enlarged plan view of a first pixel of a display panel according to an exemplary embodiment.

FIG. 3 is an enlarged plan view of a part of a display panel DP illustrating a first pixel PX1 and a second pixel PX2 according to an exemplary embodiment. FIG. 4 is an enlarged plan view of the first pixel PX1 of a display panel DP according to an exemplary embodiment.

Referring to FIG. 3, the first pixel PX1 and the second pixel PX2 are arranged along a first direction DR1. The second pixel PX2 is spaced in the first direction DR1 with respect to the first pixel PX1.

The first pixel PX1 and the second pixel PX2 may provide an image of the same color. For example, the first pixel PX1 and the second pixel PX2 may transmit one of red, blue, or green light to realize an image of red, blue, or green. However, this is merely an example and the exemplary embodiments are not limited thereto. For example, the first pixel PX1 and the second pixel PX2 may provide images of different colors.

The first pixel PX1 includes a first pixel electrode PE1 and a first pixel transistor TR1, and the second pixel PX2 may include a second pixel electrode PE2 and a second pixel transistor TR2.

The first pixel transistor TR1 may include a first control electrode GE1, a first electrode SE1, a second electrode DE1, and a first semiconductor pattern AP1. The second pixel transistor TR2 may include a second control electrode GE2, a first electrode SE2, a second electrode DE2, and a second semiconductor pattern AP2. Each of the first pixel transistor TR1 and the second pixel transistor TR2 may have substantially the same cross-sectional structure as the cross-sectional structure shown in FIG. 2. However, the cross-sectional structure of the transistor shown in FIG. 2 is merely one example, and the exemplary embodiments are not limited thereto.

Each of the first gate line GLa and the second gate line GLb extends along the second direction DR2 intersecting the first direction DR1 and each of the first data line DLa and the second data line DLb extends along the first direction DR1.

The first control electrode GE1 extends from the first gate line GLa and the second control electrode GE2 extends from the second gate line GLb. The first electrode SE1 extends from the first data line DLa and the first electrode SE2 extends from the second data line DLb. The second electrode DE1 is spaced apart from the first electrode SE1 and overlaps the first semiconductor pattern AP1 on the planar view. The second electrode DE2 is spaced apart from the first electrode SE2 and overlaps the second semiconductor pattern AP2 on the planar view.

Referring to FIG. 3, a portion of the second electrode DE1 overlapping with the first semiconductor pattern AP1 extends only in the first direction DR1. Therefore, even if the arrangement between a layer with the first semiconductor pattern AP1 and a layer with the second electrode DE1 is distorted, the gate capacitance Cgs of the first pixel transistor TR1 may be maintained relatively consistent. In this case, one part of the first pixel transistor TR1 may overlap with another pixel (for example, the second pixel PX2). For example, a part of the first electrode SE1 may overlap with the second pixel electrode PE2. In FIG. 3, a first overlapping region OLAa and a second overlapping region OLAb in which the first electrode overlaps the pixel electrodes are shown.

The first pixel electrode PE1 may include a first main pixel electrode MPE1, a first contact electrode TCPE1, a first connection electrode SCPE1, and a first compensation electrode CPE1. The first main pixel electrode MPE1, the first contact electrode TCPE1, the first connection electrode SCPE1, and the first compensation electrode CPE1 are connected to each other to form one pixel electrode. That is, the first main pixel electrode MPE1, the first contact electrode TCPE1, the first connection electrode SCPE1, and the first compensation electrode CPE1 may include the same material and may be formed simultaneously through the same process. The second pixel electrode PE2 may include a second main pixel electrode MPE2, a second contact electrode TCPE2, a second connection electrode SCPE2, and a second compensation electrode CPE2.

Referring to FIG. 4, the first main pixel electrode MPE1 may include a vertical electrode VP, a horizontal electrode HP, first branch electrodes B1, second branch electrodes B2, third branch electrodes B3, and fourth branch electrodes B4. The vertical electrode VP, the horizontal electrode HP, the first branch electrodes B1, the second branch electrodes B2, the third branch electrodes B3, and the fourth branch electrodes B4 are connected to each other to form one first main pixel electrode MPE1.

The vertical electrode VP extends along the first direction DR1 and the horizontal electrode HP extends along the second direction DR2. Each of the first branch electrodes B1, the second branch electrodes B2, the third branch electrodes B3, and the fourth branch electrodes B4 extends from the vertical electrode VP or the horizontal electrode HP. The first branch electrodes B1 extend along the fourth direction DR4, the second branch electrodes B2 extend along the fifth direction DR5, the third branch electrodes B3 extend along the sixth direction DR6, and the fourth branch electrodes B4 extend along the seventh direction DR7.

The second main pixel electrode MPE2 may have a structure similar to that of the first main pixel electrode MPE1. Therefore, the description of the second main pixel electrode MPE2 is omitted.

Each of the first main pixel electrode MPE1 and the second main pixel electrode MPE2 may overlap both the first data line DLa and the second data line DLb.

The first contact electrode TCPE1 contacts the first pixel transistor TR1. For example, the first contact electrode TCPE1 may contact the second electrode DE1 of the first pixel transistor TR1 exposed by the contact hole CNT. The second contact electrode TCPE2 contacts the second pixel transistor TR2. For example, the second contact electrode TCPE2 may contact the second electrode DE2 of the second pixel transistor TR2 exposed by the contact hole CNT. In an exemplary embodiment, the contact hole CNT may be disposed at the center of the width of the second direction DR2 of each of the first and second pixels XP1 and PX2.

The first connection electrode SCPE1 connects the first main pixel electrode MPE1 and the first contact electrode TCPE1. The first connection electrode SCPE1 may include a first sub connection electrode SCPE1*a* and a second sub connection electrode SCPE1*b*. The first sub connection electrode SCPE1*a* and the second sub connection electrode SCPE1*b* may be disposed with a first contact electrode TCPE1 interposed therebetween. The first sub connection electrode SCPE1*a* overlaps the first data line DLa and the second sub connection electrode SCPE1*b* overlaps the second data line DLb.

The second connection electrode SCPE2 connects the second main pixel electrode MPE2 and the second contact electrode TCPE2. The second connection electrode SCPE2 may include a first sub connection electrode SCPE2*a* and a second sub connection electrode SCPE2*b*.

The first compensation electrode CPE1 may extend from the first contact electrode TCPE1. The first compensation electrode CPE1 may be spaced apart from the first connection electrode SCPE1 on the planar view. As the width of the first connection electrode SCPE1 increases, the probability of cracking in the first connection electrode SCPE1 may increase. According to an exemplary embodiment, the first compensation electrode CPE1 is spaced apart from the first connection electrode SCPE1. Thus, the probability of cracking in the first connection electrode SCPE1 may be reduced. On the planar view, the first compensation electrode CPE1 and the first data line DLa may overlap each other. Capacitance may be formed between the first compensation electrode CPE1 and the first data line DLa. The capacitance is referred to as a compensation capacitance. The compensation capacitance may compensate for a difference between a first capacitance formed between the first data line DLa and the first pixel electrode PE1 and a second capacitance formed between the second data line DLb and the first pixel electrode PE1.

In the first overlapping region OLAa, a portion of the first electrode extending from the second data line DLb overlaps the first pixel electrode PE1. Thus, the magnitude of the second capacitance formed between the second data line DLb and the first pixel electrode PE1 may be increased by the capacitance formed in the overlapping region OLAa. To compensate for this, the first compensation electrode CPE1 may be provided. That is, the first capacitance may include the capacitance formed between the first data line DLa and the first main pixel electrode MPE1 and the capacitance formed between the first data line DLa and the first compensation electrode CPE1.

Data voltages of different polarities may be provided to the first data line DLa and the second data line DLb. Therefore, the values of the first capacitance and the second capacitance may be canceled out, and as a result, the probability of occurrence of vertical crosstalk may be reduced so that the image quality of the display device DD (referring to FIG. 1) may be improved.

The magnitude of the capacitance between the first compensation electrode CPE1 and the first data line DLa may be adjusted by adjusting the width WT of the first compensation electrode CPE1. The width WT may be a width in a direction parallel to the first direction DR1.

Referring to FIG. 3, on the planar view, the second compensation electrode CPE2 and the second data line DLb may overlap each other. A capacitance may be formed between the second compensation electrode CPE2 and the second data line DLb. Accordingly, as the portion of the second electrode DE1 of the first pixel transistor TR1 overlaps with the second pixel electrode PE2 in the second overlapping region OLAb, the generated capacitance may be canceled out by the capacitance formed between the second compensation electrode CPE2 and the second data line DLb.

According to an exemplary embodiment, the pixels PX1 and PX2 arranged in the first direction DR1 are alternately connected to the first data line DLa or the second data line DLb. Each of the first compensation electrode CPE1 and the second compensation electrode CPE2 may extend in a direction toward the data line electrically connected to the first compensation electrode CPE1 and the second compensation electrode CPE2. For example, the first compensation electrode CPE1 may extend from the first contact electrode TCPE1 toward the first data line DLa, and the second compensation electrode CPE2 may extend in a direction from the second contact electrode TCPE2 toward the second data line DLb.

On the planar view, the first compensation electrode CPE1 may be disposed between the first connection electrode SCPE1 and the second main pixel electrode MPE2. For example, the first compensation electrode CPE1 may be disposed in a region between the first main pixel electrode MPE1 and the first pixel transistor TR1.

The pixel common electrode CPE may be disposed between the first pixel electrode PE1 and the second pixel electrode PE2. The pixel common electrode CPE may be formed of the same material on the same layer as the first pixel electrode PE1 and the second pixel electrode PE2. The pixel common electrode CPE may receive the same voltage as the common electrode CE (see FIG. 2). Therefore, the liquid crystal molecules disposed between the pixel common electrode CPE and the common electrode CE may maintain a vertically aligned state. Therefore, it is possible to prevent the light leakage phenomenon from occurring at the boundary between the pixel and the pixel. On the planar view, the first compensation electrode CPE1 may be disposed between the first connection electrode SCPE1 and the pixel common electrode CPE.

A storage electrode STE may be disposed under the first pixel electrode PE1. The storage electrode STE may be formed of the same material on the same layer as the control electrode GE.

Referring to FIG. 4, a dummy active pattern DAP is disposed between the storage electrode STE and the first data line DLa and between the storage electrode STE and the second data line DLb, and between the first gate line GLa and the first data line DLa and between the first gate line GLb and the second data line DLb. The dummy active pattern DAP may be formed of the same material on the same layer as the first semiconductor pattern AP1. The dummy active pattern DAP may be provided to prevent the two spaced apart structures from being shorted to each other with the dummy active pattern DAP therebetween on a cross-section. However, in another exemplary embodiment, the dummy active pattern DAP may be omitted.

Figure 5:
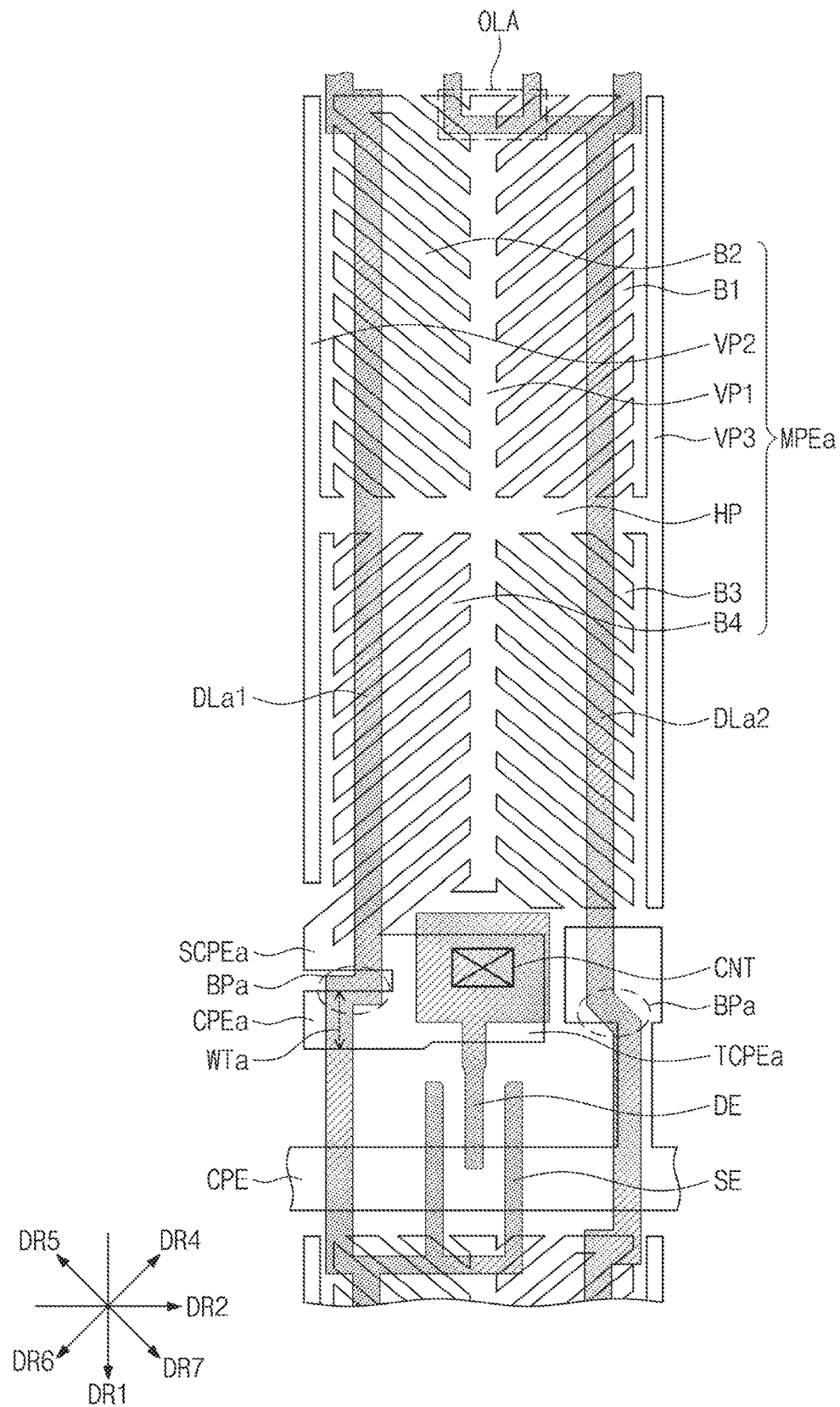
FIG. 5 is an enlarged plan view of a part of a display panel according to an exemplary embodiment.

FIG. 5 is an enlarged plan view of a part of a display panel according to an exemplary embodiment.

Referring to FIG. 5, a main pixel electrode MPEa may include vertical electrodes VP1, VP2, and VP3, a horizontal electrode HP, first branch electrodes B1, second branch electrodes B2, third branch electrodes B3, and fourth branch electrodes B4. The vertical electrodes VP1, VP2, and VP3, the horizontal electrode HP, the first branch electrodes B1, the second branch electrodes B2, the third branch electrodes B3, and the fourth branch electrodes B4 may be connected to each other to form one main pixel electrode MPEa.

Each of the vertical electrodes VP1, VP2, and VP3 extends along the first direction DR1 and the horizontal electrode HP extends along the second direction DR2. The vertical electrodes VP1, VP2, and VP3 may include a first vertical electrode VP1, a second vertical electrode VP2, and a third vertical electrode VP3. The first vertical electrode VP1 and the horizontal electrode HP may intersect each other. The second vertical electrode VP2 may extend from one end of the horizontal electrode HP along the first direction DR1. The third vertical electrode VP3 may extend in the first direction DR1 from the other end of the horizontal electrode HP.

Each of the first branch electrodes B1, the second branch electrodes B2, the third branch electrodes B3, and the fourth branch electrodes B4 extends from the first vertical electrode VP1 or the horizontal electrode HP. The first branch electrodes B1 extend along the fourth direction DR4, the second branch electrodes B2 extend along the fifth direction DR5, the third branch electrodes B3 extend along the sixth direction DR6, and the fourth branch electrodes B4 extend along the seventh direction DR7.

Slits are defined between each of the first branch electrodes B1, the second branch electrodes B2, the third branch electrodes B3, and the fourth branch electrodes B4 and the second vertical electrode VP2, between each of the first branch electrodes B1, the second branch electrodes B2, the third branch electrodes B3, and the fourth branch electrodes B4 and the third vertical electrode VP3. The arrangement of the liquid crystal molecules can be controlled by the slits.

The contact electrode TCPEa contacts the second electrode DE exposed by the contact hole CNT. The contact electrode TCPEa and the main pixel electrode MPEa are connected by a connection electrode SCPEa. In the exemplary embodiment of FIG. 5, the connection electrode SCPEa overlaps only the first data line DLa1 and does not overlap the second data line DLa2. Therefore, the capacitance formed between the second data line DLa2 and the main pixel electrode MPEa in the overlapping region OLA may be cancelled out by the capacitance formed between the connection electrode SCPEa and the first data line DLa1 and the capacitance formed between the compensation electrode CPEa and the first data line DLa1.

In the exemplary embodiment of FIG. 4, the bent portions BP of the first data line DLa and the second data line DLb overlap with the main pixel electrode MPE1. However, referring to FIG. 5, the bent portion BPa of each of the first data line DLa1 and the second data line DLa2 does not overlap with the main pixel electrode MPEa. Also, the width WTa of the compensation electrode CPEa in the first direction DR1 may be adjusted to be overlapped with the bent portion BPa on the planar view. That is, the overlapping degree of the bent portion BPa and the compensation electrode CPEa is adjusted to be used as a compensation means for removing the capacitance that affects image quality.

Also, according to an exemplary embodiment, the compensation electrode CPEa is provided apart from the connection electrode SCPEa. As the width of the connection electrode SCPEa increases, the probability of cracking in the connection electrode SCPEa may increase. For example, if only the width of the connection electrode SCPEa is adjusted (or increased) without providing the compensation electrode CPEa to compensate for the capacitance generated between the second data line DLa2 and the main pixel electrode MPEa in the overlapping region OLA, the increased width of the connection electrode SCPEa may cause cracks in the connection electrode SCPEa. In this case, a sufficient voltage may not be provided to the main pixel electrode MPEa, and image quality deterioration may occur accordingly. However, according to an exemplary embodiment, the width of the compensation electrode CPEa spaced apart from the connection electrode SCPEa is adjusted to adjust the capacitance. Thus, the probability of cracking in the connection electrode SCPEa may be reduced.

Figure 6:
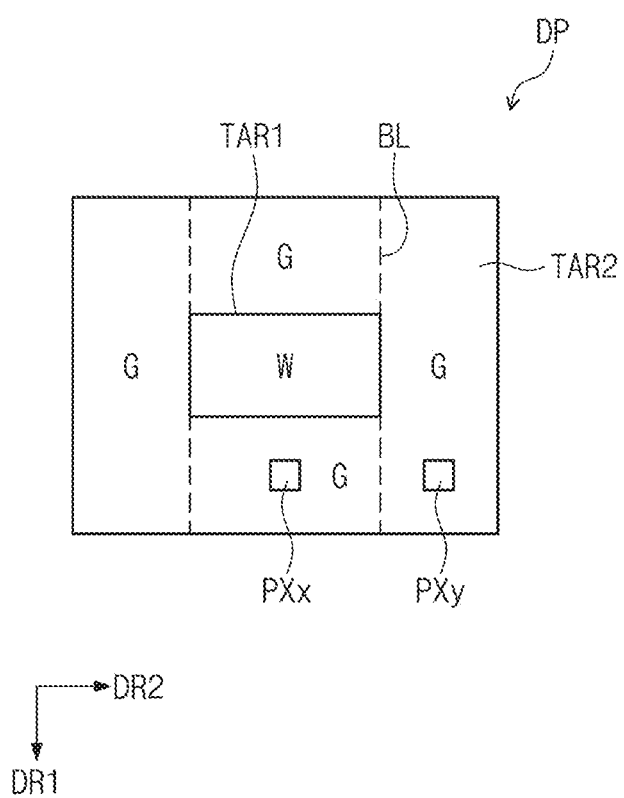
FIG. 6 is a plan view of a display panel according to an exemplary embodiment.
Figure 7:
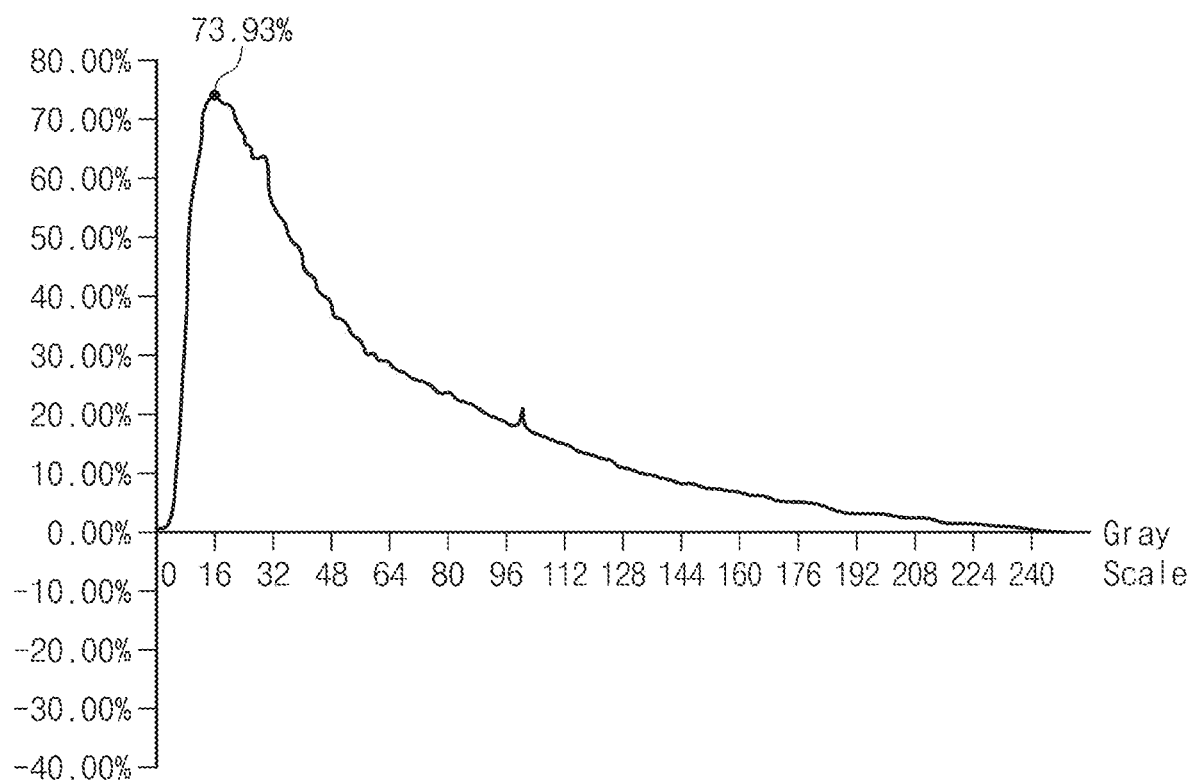
FIG. 7 is a graph showing the luminance difference for each grayscale according to a comparative example.
Figure 8:
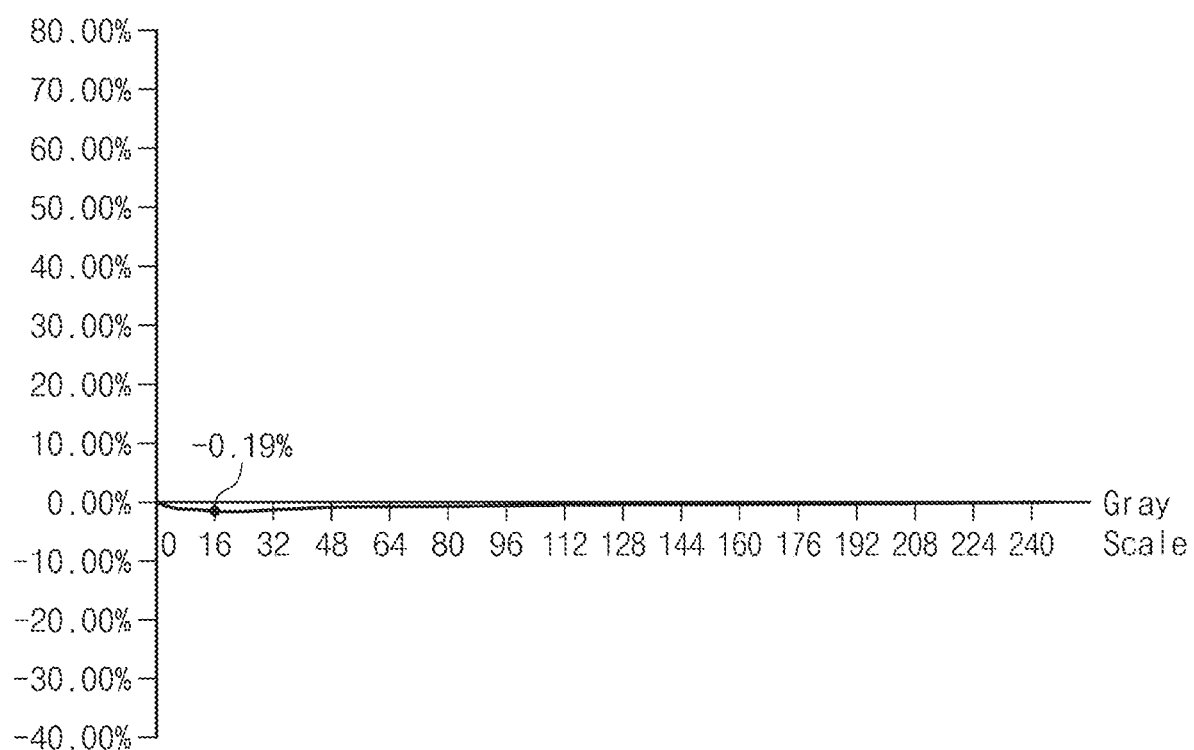
FIG. 8 is a graph showing the luminance difference for each grayscale according to an exemplary embodiment.

FIG. 6 is a plan view of a display panel according to an exemplary embodiment. FIG. 7 is a graph showing the luminance difference for each gradation according to a comparative example. FIG. 8 is a graph showing the luminance difference for each gradation according to an exemplary embodiment.

A method for testing the image quality of a display panel DP will be described with reference to FIG. 6. A white image W is displayed in the first display area TAR1 of the display area of the display panel DP. Images of various gradations G are displayed in the second display area TAR2 surrounding the first display area TAR1.

The gradation G of the image displayed in the second display area TAR2 is changed and the luminance difference between the first pixels PXx and the second pixels PXy is measured.

The first pixels PXx may be pixels arranged under the first display area TAR1. For example, the first pixels PXx may be pixels spaced in the first direction DR1 with respect to the first display area TAR1. In FIG. 6, only one of the first pixels PXx is shown.

The second pixels PXy may be pixels that do not overlap with the first display area TAP1 in the first direction DR1. That is, the second pixels PXy may be pixels spaced from the boundary BL between the first display area TAR1 and the second display area TAR2 in the second direction DR2. The boundary BL means a boundary extending in the first direction DR1. In FIG. 6, only one of the second pixels PXy is shown.

The voltage of the pixel electrode may be changed by the capacitance between the data line and the pixel electrode. Accordingly, the luminance between the first pixels PXx and the second pixels PXy may be varied.

Referring to FIG. 7, it is a graph illustrating luminance differences between first pixels PXx and second pixels PXy according to a comparative example. Referring to FIG. 7, it is a graph illustrating luminance differences between first pixels PXx and second pixels PXy according to a comparative example. As shown in the graph of FIG. 7, the maximum luminance difference between the first pixels PXx and the second pixels PXy is 73.93% at a low gradation, for example, around 16 gradations. Therefore, the boundary BL may be visually recognized by the vertical crosstalk, and the image quality of the display device may be deteriorated.

Referring to FIG. 8, it is a graph illustrating luminance differences between first pixels PXx and second pixels PXy according to an exemplary embodiment. Specifically, the graph of FIG. 8 shows the difference in luminance between the first pixels PXx and the second pixels PXy, where the width WTa (see FIG. 5) of the compensation electrode CPEa (see FIG. 5) is 10.5 µm.

Referring to FIG. 8, the maximum luminance difference between the first pixels PXx and the second pixels PXy is −0.19%. If the luminance difference is less than 15%, for example, less than 5%, then the boundary BL may be hardly visible. According to an exemplary embodiment, since the maximum luminance difference is −0.19%, the boundary BL may not be seen by the user. Thus, the image quality of the display device DD (see FIG. 1) may be improved.

The pixel electrode of the display device according to the inventive concept includes a compensation electrode. A difference between the capacitance between the first data line and the pixel electrode and the capacitance between the second data line and the pixel electrode may be minimized by the compensation electrode. Therefore, the vertical crosstalk phenomenon may be prevented, and the image quality of the display device may be improved accordingly.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
a first pixel transistor;
a first gate line electrically connected to the first pixel transistor;
a first data line electrically connected to the first pixel transistor;
a first pixel electrode electrically connected to the first pixel transistor and configured to overlap the first data line on a planar view, the first pixel electrode comprising:
a first main pixel electrode;

a first contact electrode contacting the first pixel transistor;
a first connection electrode connecting the first main pixel electrode and the first contact electrode; and
a first compensation electrode extending from the first contact electrode, spaced apart from the first connection electrode, and overlapping the first data line on the planar view;
a second data line configured to overlap the first pixel electrode on the planar view;
a second pixel electrode spaced apart from the first pixel electrode in a first direction;
a second pixel transistor electrically connected to the second pixel electrode and the second data line; and
a second gate line electrically connected to the second pixel transistor,
wherein the second pixel electrode comprises:
a second main pixel electrode;
a second contact electrode contacting the second pixel transistor;
a second connection electrode connecting the second main pixel electrode and the second contact electrode; and
a second compensation electrode extending from the second contact electrode, spaced apart from the second connection electrode, and overlapping the second data line on the planar view,
wherein a compensation capacitance is formed between the second compensation electrode and the second data line.

2. The display device of claim 1, wherein the first gate line and the second gate line are configured to receive the same signal.

3. The display device of claim 1, wherein the first connection electrode comprises a first sub connection electrode and a second sub connection electrode,
wherein the first sub connection electrode overlaps the first data line on the planar view, and
wherein the second sub connection electrode overlaps the second data line on the planar view.

4. The display device of claim 1, wherein the first data line and the second data line are configured to receive data voltages of different polarities.

5. The display device of claim 1, wherein the first compensation electrode is disposed between the first connection electrode and the second main pixel electrode on the planar view.

6. The display device of claim 5, further comprising a pixel common electrode disposed between the first pixel electrode and the second pixel electrode, wherein the first compensation electrode is disposed between the first connection electrode and the pixel common electrode on the planar view.

7. The display device of claim 1, wherein the first pixel transistor comprises a control electrode extending from the first gate line, a first electrode extending from the first data line, and a second electrode connected to the first contact electrode,
wherein a portion of the first electrode overlaps the second main pixel electrode on the planar view.

8. The display device of claim 7, wherein a first capacitance is formed between the second data line and the second pixel electrode,
wherein a second capacitance is sum of a capacitance formed between the first data line and the second pixel electrode and a capacitance formed between the first electrode and the second pixel electrode, and wherein the first capacitance is substantially equal to the second capacitance.

9. The display device of claim 8, wherein the first capacitance comprises a capacitance formed between the second data line and the second main pixel electrode and the compensation capacitance.

10. A display device comprising:
a first data line and a second data line extending along a first direction;
a first pixel comprising a first pixel transistor and a first pixel electrode electrically connected to the first data line; and
a second pixel comprising a second pixel transistor and a second pixel electrode, the second pixel being spaced apart from the first pixel in the first direction and electrically connected to the second data line,
wherein the first pixel electrode comprises:
a first main pixel electrode; and
a first compensation electrode overlapping the first data line in a planar view,
wherein a portion of the second pixel transistor overlaps the first main pixel electrode in the planar view,
wherein the second pixel electrode comprises:
a second main pixel electrode;
a second contact electrode contacting the second pixel transistor;
a second connection electrode connecting the second main pixel electrode and the second contact electrode; and
a second compensation electrode extending from the second contact electrode, spaced apart from the second connection electrode, and overlapping the second data line in the planar view.

11. The display device of claim 10, wherein a first capacitance is a sum of a capacitance formed between the first data line and the first main pixel electrode and a capacitance formed between the first data line and the first compensation electrode,
wherein a second capacitance is a sum of a capacitance formed between the first main pixel electrode and the second data line and a capacitance formed between the first main pixel electrode and the portion of the second pixel transistor overlapping the first main pixel, and
wherein the compensation electrode is adjusted so that the first capacitance is substantially equal to the second capacitance.

12. The display device of claim 10, wherein the first pixel electrode overlaps the first data line and the second data line on the planar view and the second pixel electrode overlaps the first data line and the second data line on the planar view.

13. The display device of claim 10, wherein the first compensation electrode is disposed in an area between the first main pixel electrode and the first pixel transistor on the planar view.

14. The display device of claim 10, further comprising:
a first gate line extending along a second direction intersecting the first direction and electrically connected to the first pixel transistor; and
a second gate line extending along the second direction and electrically connected to the second pixel transistor,
wherein the first gate line and the second gate line are configured to receive the same signal.

15. The display device of claim 14, wherein the first pixel transistor comprises a control electrode extending from the first gate line, a first electrode extending from the first data line, and a second electrode connected to the first pixel electrode, wherein a portion of the first electrode overlaps the second pixel electrode on the planar view.

16. The display device of claim 10, wherein the first pixel electrode further comprises:
    a first contact electrode contacting the first pixel transistor; and
    a first sub connection electrode connecting the first main pixel electrode and the first contact electrode, and overlapping the first data line on the planar view.

17. The display device of claim 16, further comprising a second sub connection electrode connecting the first main pixel electrode and the first contact electrode and overlapping the second data line on the planar view.

18. The display device of claim 16, wherein the first compensation electrode is spaced apart from the first sub connection electrode on the planar view.

* * * * *